United States Patent
Ahn et al.

(10) Patent No.: US 9,966,126 B2
(45) Date of Patent: May 8, 2018

(54) DELAY CIRCUIT OF A SEMICONDUCTOR MEMORY DEVICE, A SEMICONDUCTOR MEMORY DEVICE AND A METHOD OF OPERATING THE SAME

(71) Applicant: SAMSUNG ELECTRONICS CO., LTD., Suwon-si, Gyeonggi-do (KR)

(72) Inventors: Sung-Oh Ahn, Osan-si (KR); Sukyong Kang, Hwaseong-si (KR); Hye-Seung Yu, Goyang-si (KR); Jae-Hun Jung, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/486,689

(22) Filed: Apr. 13, 2017

(65) Prior Publication Data

US 2017/0372764 A1 Dec. 28, 2017

(30) Foreign Application Priority Data

Jun. 22, 2016 (KR) .......................... 10-2016-0078162

(51) Int. Cl.
| | |
|---|---|
| *G11C 11/00* | (2006.01) |
| *G11C 11/16* | (2006.01) |
| *G11C 11/4076* | (2006.01) |
| *G11C 13/00* | (2006.01) |
| *G06F 11/10* | (2006.01) |

(52) U.S. Cl.
CPC ...... *G11C 11/1693* (2013.01); *G06F 11/1004* (2013.01); *G11C 11/161* (2013.01); *G11C 11/4076* (2013.01); *G11C 13/004* (2013.01); *G11C 13/0007* (2013.01); *G11C 13/0061* (2013.01); *G11C 13/0069* (2013.01)

(58) Field of Classification Search
CPC .............. G11C 11/1693; G11C 11/161; G11C 11/4076; G11C 13/0007; G11C 13/004; G11C 13/0061; G11C 13/0069; G06F 11/1004
See application file for complete search history.

(56) References Cited

U.S. PATENT DOCUMENTS

| | | | |
|---|---|---|---|
| 6,622,256 B1 * | 9/2003 | Dabral | ................ H03K 5/1252 365/193 |
| 7,872,507 B2 | 1/2011 | Gomm | |
| 7,949,482 B2 | 5/2011 | Gebara et al. | |

(Continued)

*Primary Examiner* — Toan Le
(74) *Attorney, Agent, or Firm* — F. Chau & Associates, LLC

(57) ABSTRACT

A delay circuit of a semiconductor memory device includes a delay chain, a first phase converter and a second phase converter. The delay chain is connected between an input terminal and an output terminal, includes 2N delay cells, and delays a first intermediate signal to generate a second intermediate signal. The first phase converter is connected to the input terminal, and provides the first intermediate signal to the delay chain, wherein the first intermediate signal is generated by inverting a phase of an input signal or by maintaining the phase of the input signal in response to a control signal. The second phase converter is connected to the output terminal, and generates an output signal by inverting a phase of the second intermediate signal or by maintaining the phase of the second intermediate signal in response to the control signal.

20 Claims, 14 Drawing Sheets

(56) References Cited

U.S. PATENT DOCUMENTS

| | | |
|---|---|---|
| 8,786,339 B2 | 7/2014 | Ma |
| 8,923,082 B2 | 12/2014 | Kodama |
| 8,942,049 B2 | 1/2015 | Sridhara |
| 9,251,890 B1 | 2/2016 | Agarwal et al. |
| 2006/0103566 A1* | 5/2006 | Vemulapalli .......... G04F 10/005 341/155 |
| 2011/0006851 A1* | 1/2011 | Kim ....................... H03K 5/133 331/57 |
| 2015/0003177 A1 | 1/2015 | Fujishiro |
| 2015/0228357 A1 | 8/2015 | Arsovski et al. |
| 2016/0056825 A1* | 2/2016 | Vlachogiannakis . H03B 5/1265 327/142 |
| 2017/0221554 A1* | 8/2017 | Baeck ................... G11C 11/419 |

\* cited by examiner

DELAY CIRCUIT OF A SEMICONDUCTOR MEMORY DEVICE, A SEMICONDUCTOR MEMORY DEVICE AND A METHOD OF OPERATING THE SAME

CROSS-REFERENCE TO RELATED APPLICATION(S)

This application claims priority under 35 U.S.C. § 119 to Korean Patent Application No. 10-2016-0078162, filed on Jun. 22, 2016 in the Korean Intellectual Property Office, the disclosure of which is incorporated by reference herein in its entirety.

TECHNICAL FIELD

Exemplary embodiments of the inventive concept relate to memory devices, and more particularly to a delay circuit of a semiconductor memory device, a semiconductor memory device and a method of operating a semiconductor memory device.

DISCUSSION OF THE RELATED ART

As semiconductor devices become highly integrated, they are increasingly vulnerable to various forms of deterioration. Among these forms of deterioration are temperature effects. For example, in a p-channel metal oxide semiconductor (PMOS) transistor, during application of a negative gate voltage, a temperature increase can produce Negative Bias Temperature Instability (NBTI) effects. NBTI effects cause a decrease in an absolute value of a drain current, an increase in an absolute value of a threshold voltage and an increase in a Gate Induced Drain Leakage (GIDL) current.

For example, if the negative voltage is applied to the gate of the PMOS transistor while its drain and source are grounded, a positive charge interface trap may be formed in a gate oxide film. Thus, the NBTI effects hinder formation of a channel, and consequently, a threshold voltage of the PMOS transistor increases and an absolute value of its drain current decreases. In addition, an energy band between the gate and the drain of the PMOS transistor may be bent by its gate voltage. In this case, because tunneling is easily generated, the GIDL current may increase. Further, because NBTI may cause a significant variation in a threshold voltage at a particular bias and high-temperature state, reliability of a high-speed semiconductor process may drop.

SUMMARY

According to an exemplary embodiment of the inventive concept, a delay circuit of a semiconductor memory device includes a delay chain, a first phase converter and a second phase converter. The delay chain is connected between an input terminal and an output terminal, includes at least 2N (N is a natural number greater than two) delay cells, and delays a first intermediate signal to generate a second intermediate signal. The first phase converter is connected to the input terminal, and generates the first intermediate signal to the delay chain by inverting a phase of an input signal or by maintaining the phase of the input signal in response to a control signal. The second phase converter is connected to the output terminal, and generates an output signal by inverting a phase of the second intermediate signal or by maintaining the phase of the second intermediate signal in response to the control signal.

According to an exemplary embodiment of the inventive concept, a semiconductor memory device includes a memory cell array, a control logic circuit and a delay circuit. The memory cell array includes a plurality of memory cells coupled to a plurality of word-lines and a plurality of bit-lines. The control logic circuit controls an access to the memory cell array in response to a command and an address. The delay circuit is disposed along a command path, an address path or a data path of the semiconductor memory device. A command is provided through the command path, an address is provided through the address path and data is provided to the memory cell array through the data path. The delay circuit includes a delay chain, a first phase converter and a second phase converter. The delay chain is connected between an input terminal and an output terminal, includes at least 2N (N is a natural number greater than two) delay cells, and delays a first intermediate signal to generate a second intermediate signal. The first phase converter is connected to the input terminal, and provides the first intermediate signal to the delay chain, wherein the first intermediate signal is generated by inverting a phase of an input signal or by maintaining the phase of the input signal in response to a control signal. The second phase converter is connected to the output terminal, and generates an output signal by inverting a phase of the second intermediate signal or by maintaining the phase of the second intermediate signal in response to the control signal.

According to an exemplary embodiment of the inventive concept, there is provided a method of operating a semiconductor memory device including a delay circuit disposed along a command path, an address path or a data path of the semiconductor memory device, wherein a command is delivered through the command path, an address is delivered through the address path and data is delivered through the data path, and wherein the delay circuit includes a first phase converter, a delay chain and a second phase converter. In the method, a logic level of a control signal applied to the first phase converter and the second phase converter is changed when the command is received, a first intermediate signal is generated in the first phase converter by inverting a phase of an input signal or by maintaining the phase of the input signal in response to the control signal, the first intermediate signal is delayed to generate a second intermediate signal using the delay chain including at least 2N (N is a natural number greater than two) delay cells, and an output signal is generated in the second phase converter by inverting a phase of the second intermediate signal or by maintaining the phase of the second intermediate signal in response to the control signal.

According to an exemplary embodiment of the inventive concept, a delay circuit of a semiconductor memory device includes: a first phase converter configured to receive an input signal and generate a first signal by maintaining or inverting a phase of the input signal in response to a control signal; a plurality of delay cells configured to receive the first signal and delay the first signal to generate a second signal; and a second phase converter configured to receive the second signal and generate a third signal by maintaining or inverting a phase of the second signal in response to the control signal.

BRIEF DESCRIPTION OF THE DRAWINGS

The above and other features of the inventive concept will become more clearly understood by describing in detail exemplary embodiments thereof with reference to the accompanying drawings.

DETAILED DESCRIPTION OF THE EMBODIMENTS

Exemplary embodiments of the inventive concept will be described more fully hereinafter with reference to the accompanying drawings.

As an operating speed of a semiconductor memory device increases, an error probability of signals transmitted or received in a memory system may increase. For example, a dynamic random access memory (DRAM), which is an example of a semiconductor memory device, has finite data retention characteristics. The DRAM receives, for example, a command, an address or a chip select signal from a memory controller to perform a memory operation requested by the memory controller via an internal operation such as command decoding or address controlling. Error free operation of a semiconductor memory device is expected irrespective of the density and speed capacity of the memory device.

Figure 1:
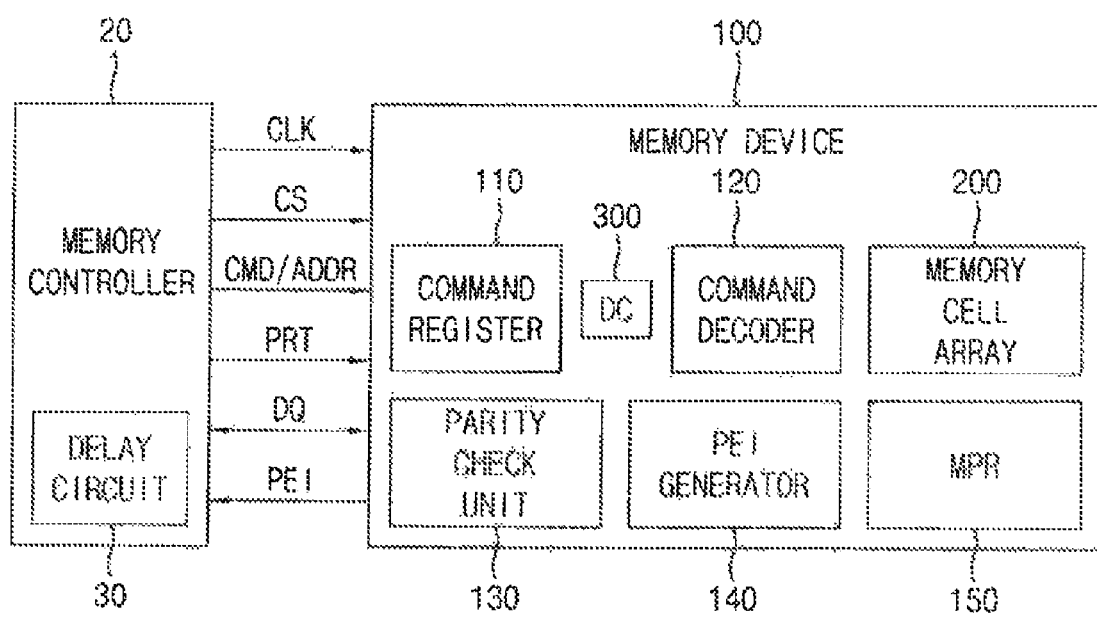
FIG. 1 is a block diagram illustrating a memory system according to an exemplary embodiment of the inventive concept.

FIG. 1 is a block diagram illustrating a memory system according to an exemplary embodiment of the inventive concept.

Referring to FIG. 1, a memory system 10 may include a memory controller 20 and a semiconductor memory device 100.

The semiconductor memory device 100 may include a memory cell array 200, a parity check unit 130, a command register 110, an information generator 140, a command decoder 120, a multiple purpose register (MPR) 150 and at least one delay circuit 300. The elements of the semiconductor memory device 100 in FIG. 1 are included to illustrate operations of a parity check according to an exemplary embodiment of the inventive concept. Other elements for conducting a memory operation such as reading or writing data may be further included in the semiconductor memory device 100.

The memory controller 20 provides various signals to the semiconductor memory device 100 to control a memory operation. For example, the memory controller 20 provides a clock signal CLK, a chip selection signal CS, a command CMD, and an address ADDR to the semiconductor memory device 100. Data DQ for reading and writing operations is transmitted or received between the memory controller 20 and the semiconductor memory device 100. The memory controller 20 may provide a parity signal PRT to the semiconductor memory device 100 for a parity check operation.

The parity signal PRT may include one bit or at least two bits, and may have a bit value according to a logic state of the command CMD and the address ADDR. The command CMD and the address ADDR may each be formed of a plurality of bits, and a bit value of the parity signal PRT may be determined according to a bit value of the command CMD and the address ADDR. For example, if the number of bits of the command CMD, the address ADDR, and the parity signal PRT having a logic high from among bit values thereof is set to be provided in an even number, and the number of bits having a logic high from among bits constituting the command CMD and the address ADDR is an odd number, then the parity signal PRT may have a logic high value. On the other hand, if the number of bits having a logic high from among bits constituting the command CMD and the address ADDR is an even number, the parity signal PRT may have a logic low value.

In an exemplary embodiment of the inventive concept, when a parity check is conducted with respect to only the command CMD, a bit value of the parity signal PRT may be determined according to a bit value of bits constituting the command CMD. In addition, if a parity check is conducted with respect to only the address ADDR, a bit value of the parity signal PRT may be determined according to a bit value of bits constituting the address ADDR.

The parity check unit 130 conducts a parity check with respect to at least one of the command CMD and the address ADDR by using the parity signal PRT received from the memory controller 20. In an exemplary embodiment of the inventive concept when a parity check is conducted with respect to the command CMD and the address ADDR, the parity check unit 130 receives the command CMD, the address ADDR, separate check bit values of the command CMD and the address ADDR, and the parity signal PRT to generate a parity check result. The information generator 140 generates parity error information PEI indicating whether there is a parity error or not, according to the parity check result, and outputs the parity error information PEI to the memory controller 20.

As a result of a parity check, if no parity error is generated, the command CMD is normally provided to the command decoder 120, and thus, an internal command is generated, and a memory operation is conducted in response to the internal command. In consideration of time needed for the parity check, the command CMD may be temporarily stored in the command register 110, and the command CMD stored in the command register 110 may be provided to the command decoder 120 in time synchronization with the parity check result when it is provided to the command decoder 120. The command register 110 may be formed of a unit such as a shift register, and another storage unit may be included in the semiconductor memory device 100 to temporarily store a chip selection signal CS provided to the command decoder 120 or the address ADDR provided to a row/column decoder.

In an exemplary embodiment of the inventive concept, the delay circuit 300 may be disposed between the command register 110 and the command decoder 120. The delay circuit 300 may delay a timing of providing the command CMD stored in the command register 110 to the command decoder 120 in time synchronization with the parity check result when it is provided to the command decoder 120.

If a parity error is generated, a further memory operation is prevented by blocking the generation of an internal command. For example, the command decoder 120 may be disabled. Alternatively, an output of the command CMD from the command register 110 is blocked.

In addition, the MPR 150 may include registers that store various pieces of information in the semiconductor memory device 100. For example, the registers may store the command CMD/address ADDR to which a parity error is generated as a result of a parity check conducted according to an exemplary embodiment of the inventive concept. In response to communication with the memory controller 20, at least some pieces of information stored in the MPR 150 may be provided to the memory controller 20. The memory controller 20 may receive information of the command CMD/address ADDR in which an error is generated, by accessing the MPR 150. The memory controller 20 may conduct an operation such as detecting an error pattern of the command CMD/address ADDR received from the semiconductor memory device 100, by analyzing the information stored in the MPR 150.

In addition, when the memory controller 20 requests an actual memory operation to be conducted, the chip selection signal CS may be activated and output with the command CMD, and when the chip selection signal CS is not activated, the semiconductor memory device 100 may be in a non-operational state. Accordingly, the parity check unit 130 may be set to operate when the chip selection signal CS is activated and, for example, the chip select signal CS may be used to control enablement of the parity check unit 130.

In addition, if the activated chip select signal CS is provided to the command decoder 120, the command decoder 120 may generate an appropriate internal command, and accordingly, if a parity error is generated, generation of the internal command may be prevented by blocking the chip selection signal CS from being provided to the command decoder 120. Herein, the chip selection signal CS is described as being included in the command CMD. Alternatively, the chip selection signal CS is assumed to be included even when the chip selection signal CS is not explicitly described hereinafter.

Figure 2:
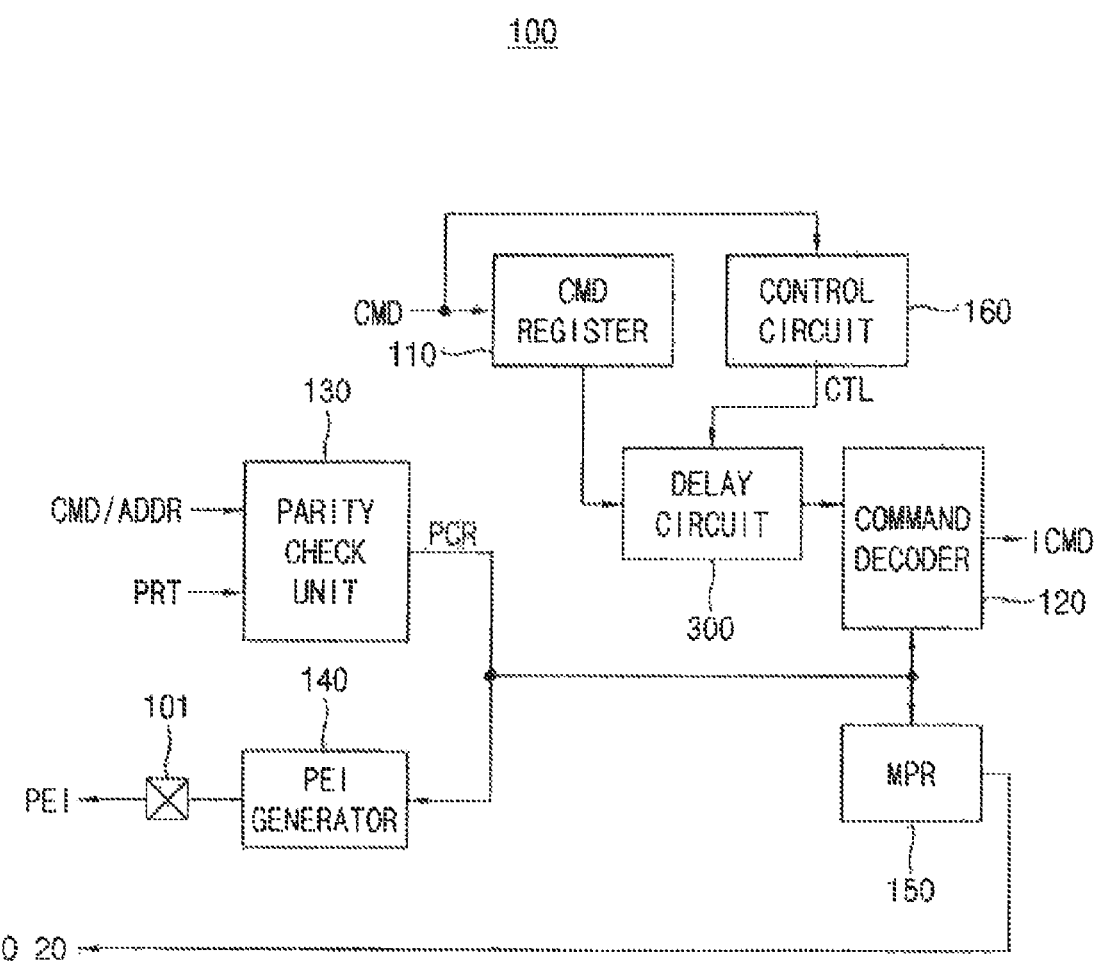
FIG. 2 is a block diagram illustrating an operation of a semiconductor memory device of FIG. 1 according to an exemplary embodiment of the inventive concept.

FIG. 2 is a block diagram illustrating an operation of the semiconductor memory device of FIG. 1 according to an exemplary embodiment of the inventive concept.

Referring to FIGS. 1 and 2, the semiconductor memory device 100 may further include a control circuit 160. The command and address CMD/ADDR and the parity signal PRT transmitted from the memory controller 20 are provided to the parity check unit 130, and the parity check unit 130 checks a bit value of each of the command CMD, the address ADDR, and the parity signal PRT to generate a parity check result PCR. The information generator 140 generates parity error information PEI according to the parity check result PCR and outputs the parity error information PEI to the memory controller 20.

The semiconductor memory device 100 may include a plurality of pins for communication with the memory controller 20, and the semiconductor memory device 100 may include an information pin (or alert pin) 101 for outputting the parity error information PEI. For example, if no parity error is generated, the information generator 140 may output inactivated (e.g., no) parity error information PEI, but if a parity error is generated, the information generator 140 may output parity error information PEI. The memory controller 20 may receive the parity error information PEI, and control a command for a subsequent memory operation to be output according to the parity error information PEI.

In addition, an operation of generating an internal command ICMD of the semiconductor memory device 100 may be controlled according to the parity check result PCR. If no parity error is generated, the command decoder 1200 may decode the command CMD to generate and output an internal command ICMD. In consideration of time needed for a parity check operation, the command CMD may be delayed for a predetermined amount of time via the delay circuit 300, and then, may be provided to the command decoder 120. On the other hand, if a parity error is generated, the command CMD may not be provided to the command decoder 120 or a signal received by the command decoder 120 may be blocked, thereby preventing output of the internal command ICMD.

The control circuit 160 may change (or transition) a logic level of a control signal CTL whenever the command CMD is applied to the control circuit 160, and may provide the control signal CTL to the delay circuit 300. The delay circuit 300 may include 2N (N is a natural number greater than two) delay chains which are cascade-connected. In the delay circuit 300, positions of delay cells, each receiving a high level signal, of the 2N delay cells, may be alternatively changed whenever a logic level of the control signal CTL is changed. In an exemplary embodiment of the inventive concept, the control circuit 160 may be included within the delay circuit 300.

Figure 3:
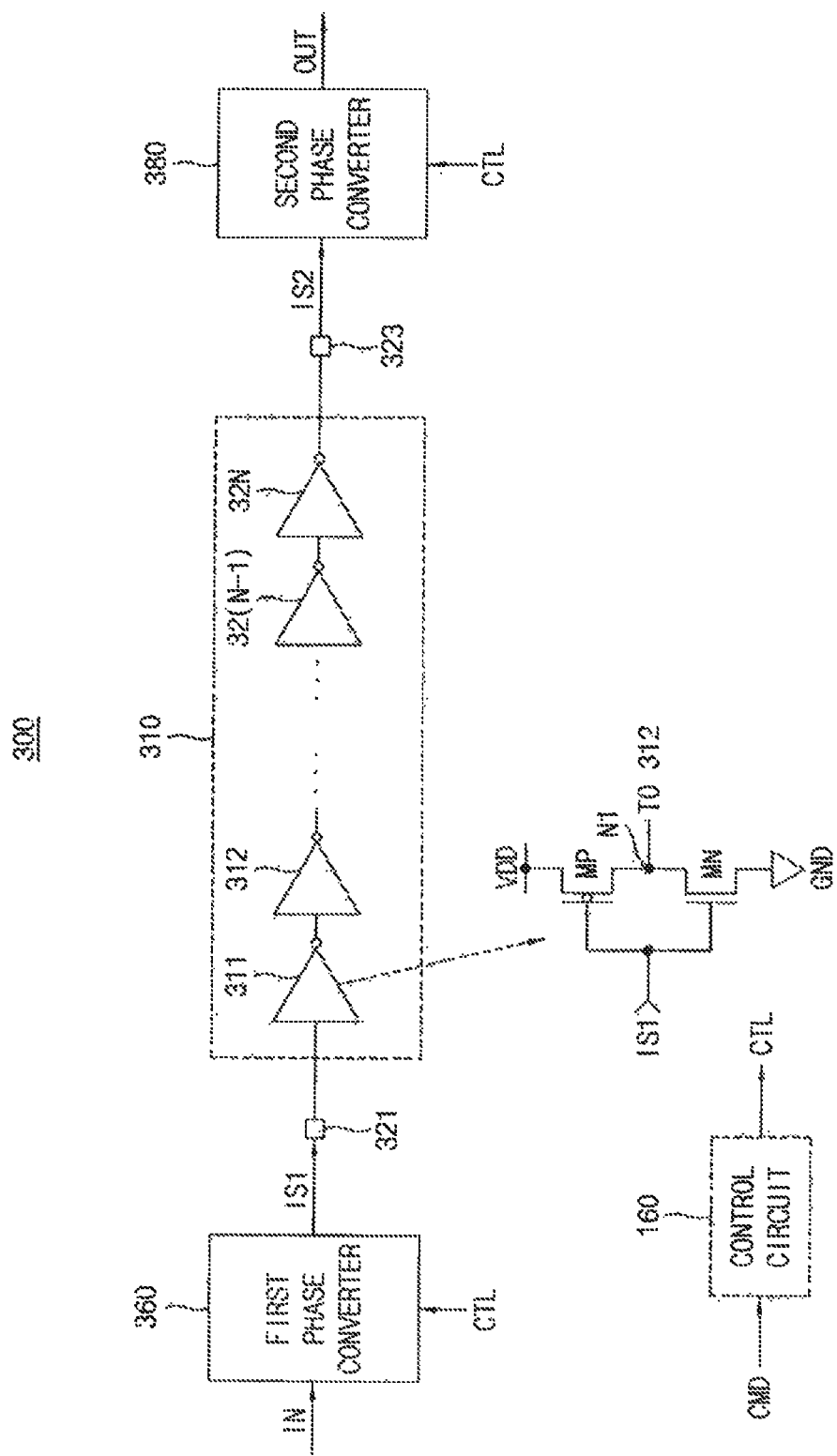
FIG. 3 is a block diagram illustrating a delay circuit in the semiconductor memory device of FIG. 2 according to an exemplary embodiment of the inventive concept.

FIG. 3 is a block diagram illustrating a delay circuit in the semiconductor memory device of FIG. 2 according to an exemplary embodiment of the inventive concept.

Referring to FIG. 3, the delay circuit 300 may include a delay chain 310, a first phase converter 360 and a second phase converter 380. The delay circuit 300 may further include a control circuit 160. The delay chain 310 may be connected between an input terminal 321 and an output terminal 323. The first phase converter 360 may be connected to the input terminal 321 and the second phase converter 380 may be connected to the output terminal 323.

The delay chain 310 may include at least 2N (N is a natural number greater than two) delay cells 311~32N which are cascade-connected and may delay a first intermediate signal IS1 to provide a second intermediate signal IS2 at the output terminal 323. Each of the 2N delay cells 311~32N may employ an inverter. For example, the delay cell 311 may include a p-channel metal oxide semiconductor (PMOS) transistor MP coupled to a power supply voltage VDD and an n-channel metal oxide semiconductor (NMOS) transistor MN coupled between the PMOS transistor MP and a ground voltage GND. The first intermediate signal IS1 is applied to gate of the PMOS transistor MP and the NMOS transistor MN, sources of the PMOS transistor MP and the NMOS transistor MN are coupled to each other at a first node N1 and the first node N1 is connected to the delay cell 312.

The first phase converter 360 is connected to the input terminal 321, receives an input signal IN and provides the first intermediate signal IS1 to the delay chain 310 by inverting a phase of the input signal IN or by maintaining the phase of the input signal IN in response to a control signal CTL. The second phase converter 380 is connected to the output terminal 323, receives the second intermediate signal IS2, and provides an output signal OUT by inverting a phase of the second intermediate signal IS2 or by maintaining the phase of the second intermediate signal IS2 in response to the control signal CTL. The control circuit 160 may change a logic level of the control signal CTL when a command CMD is input to the control circuit 160 and may apply the control signal CTL to the first phase converter 360 and the second phase converter 380. The first phase converter 360 and the second phase converter 380 operate complementarily with respect to each other in response to the control signal CTL.

Figure 4:
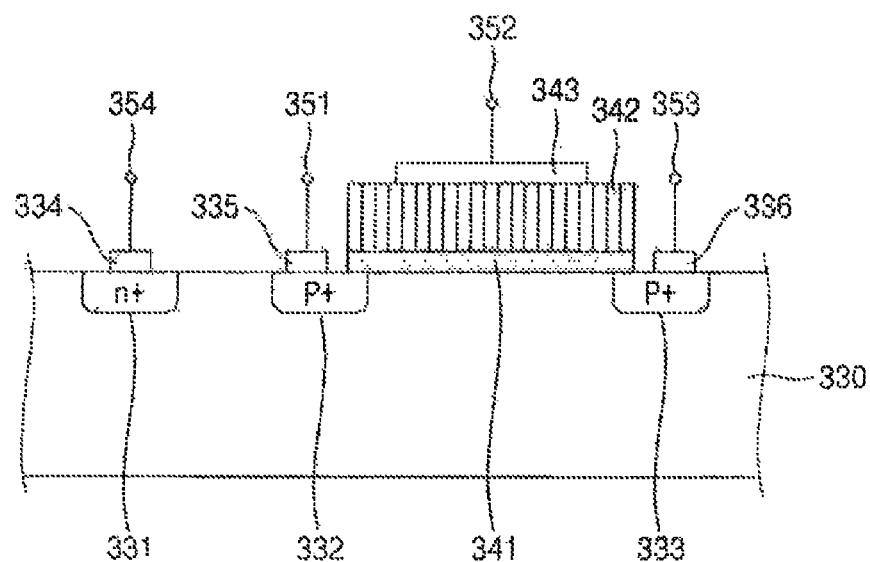
FIG. 4 is a cross-section view of a p-channel metal oxide semiconductor (PMOS) transistor in the delay cell in FIG. 3 according to an exemplary embodiment of the inventive concept.

FIG. 4 is a cross-section view of the PMOS transistor in the delay cell in FIG. 3 according to an exemplary embodiment of the inventive concept.

Referring to FIG. 4, the illustrated PMOS transistor includes p-type wells 332 and 333 formed in an n-type substrate 330 and a gate 342. The p-type wells 332 and 333 are used as a source and a drain, respectively. The gate 342 formed on a gate insulation film 341 receives a gate voltage 352 through a gate electrode 343. A source 332 receives a source voltage 351 through a source electrode 335, and a drain 333 receives a drain voltage 353 through a drain electrode 336. A body voltage 354 is applied to an n-type well 331 through a body electrode 334. The body voltage 354 can be directly applied to the n-type substrate 330.

When the drain 333 and the source 332 are grounded and a negative voltage is applied to the gate 342, a positive charge interface trap is formed in the gate insulation film 341. The positive charge interface trap hinders formation of a channel, so that a threshold voltage of the PMOS transistor is decreased. Thus, an absolute value of its drain current is decreased, and an energy band between the gate 342 and the drain 333 of the PMOS transistor is bent by its gate voltage. In this case, because tunneling is easily generated, a gate induced drain leakage (GIDL) current may increase.

When a fixed level signal is applied to the 2N delay cells 311~32N, each PMOS transistor of the 2N delay cells 311~32N may generate a negative bias temperature Instability (NPTI) phenomenon and each NMOS transistor of the 2N delay cells 311~32N may generate a positive bias temperature instability (PBTI) phenomenon.

The delay circuit 300 according to an exemplary embodiment of the inventive concept, may prevent degradation of the PMOS transistor due to NBTI effects by alternatingly changing the logic level of the control signal CTL to change in alternating fashion which delay cells of the 2N delay cells 311~32N receive a signal having a high level.

Figure 5:
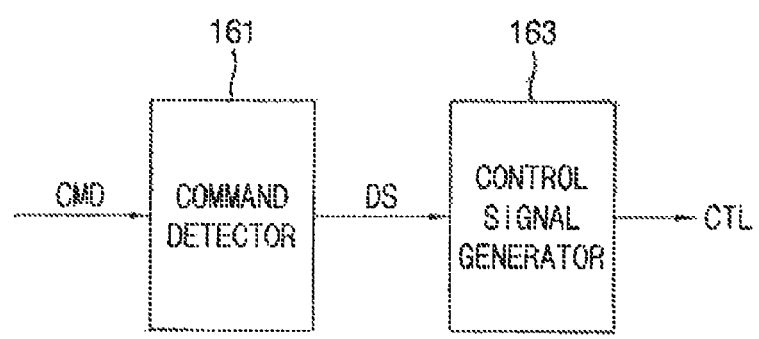
FIG. 5 is a block diagram illustrating a control circuit in the delay circuit of FIG. 3 according to an exemplary embodiment of the inventive concept.

FIG. 5 is a block diagram illustrating the control circuit in the delay circuit of FIG. 3 according to an exemplary embodiment of the inventive concept.

Referring to FIG. 5, the control circuit 160 may include a command detector 161 and a control signal generator 163.

The command detector 161 may detect an application of the command CMD to generate a detection signal DS. The command detector 161 may apply the detection signal DS which is pulse-shaped to the control signal generator 163 when the command detector 161 detects an application of the command CMD. The control signal generator 163 may generate the control signal CTL whose logic level is alternatively changed in response to the detection signal DS. The control signal generator 163 may employ a binary code generator which alternatingly generates '1' and '0' when the detection signal DS is applied to the control signal generator 163.

When the command CMD designates a write operation of the semiconductor memory device 100, the control signal CTL may have a first logic level. When the write operation of the semiconductor memory device 100 is completed and the command CMD designates a refresh operation of the semiconductor memory device 100, the control signal generator 163 may generate the control signal CTL having a second logic level different from the first logic level, in response to the detection signal DS. For example, the control signal generator 163 may change the logic level of the control signal CTL in response to the detection signal DS when an auto refresh command for the semiconductor memory device 100 is received.

Figure 6:
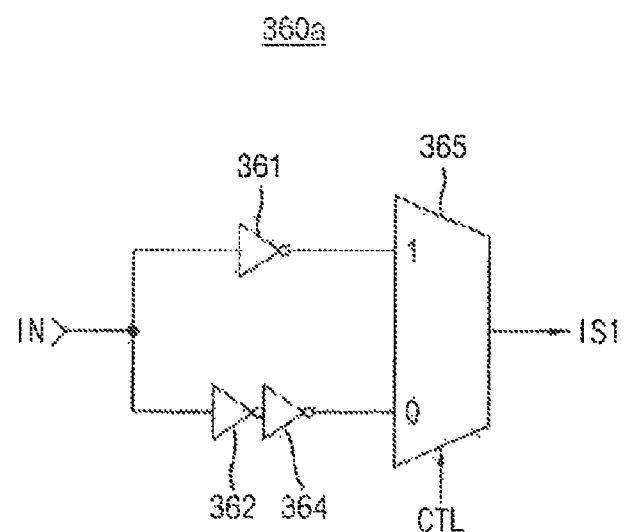
FIG. 6 is a circuit diagram illustrating a first phase converter in the delay circuit of FIG. 3 according to an exemplary embodiment of the inventive concept.

FIG. 6 is a circuit diagram illustrating the first phase converter in the delay circuit of FIG. 3 according to an exemplary embodiment of the inventive concept.

Referring to FIG. 6, a first phase converter 360a may include a first inverter 361, second and third inverters 362 and 363 and a multiplexer 365.

The first inverter 361 inverts the input signal IN to provide an inverted input signal to a first input (1) of the multiplexer 365. The second and third inverters 362 and 363, which are cascade-connected, invert the input signal IN two times (e.g., to maintain the phase of the input signal IN) to provide the input signal IN to a second input (0) of the multiplexer 365. The multiplexer 365 may select one of an output of the first inverter 361 and an output of the third inverter 363 in response to the control signal to provide the first intermediate signal IS1.

When the control signal CTL has a first logic level, the multiplexer 365 may provide the output of the first inverter 361 as the first intermediate signal IS1, and when the control signal CTL has a second logic level, the multiplexer 365 may provide the output of the third inverter 364 as the first intermediate signal IS1.

In FIG. 6, the first inverter 361 and the first input (1) of the multiplexer 365 through which the input signal IN passes when the control signal CTL has a first logic level may be referred to as an inversion path. In addition, the second and third inverters 362 and 363 and the second input (0) of the multiplexer 365 through which the input signal IN passes when the control signal CTL has a second logic level may be referred to as a non-inversion path. The inversion path and the non-inversion path may be disposed in parallel with respect to each other.

Figure 7:
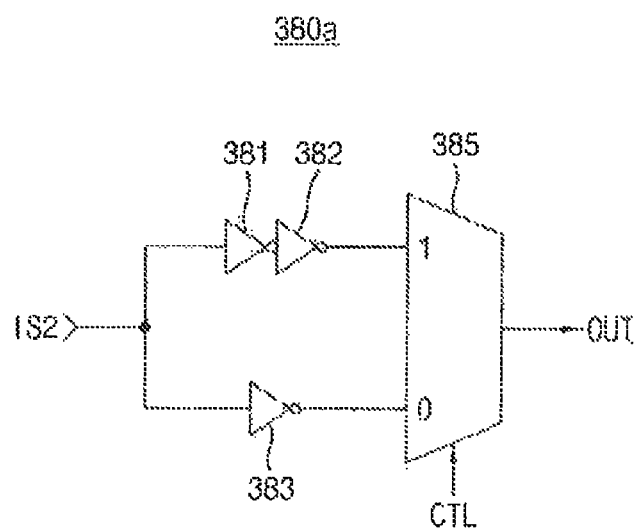
FIG. 7 is a circuit diagram illustrating a second phase converter in the delay circuit of FIG. 3 according to an exemplary embodiment of the inventive concept.

FIG. 7 is a circuit diagram illustrating the second phase converter in the delay circuit of FIG. 3 according to an exemplary embodiment of the inventive concept.

Referring to FIG. 7, a second phase converter 380a may include fourth and fifth inverters 381 and 382, a sixth inverter 383 and a multiplexer 385.

The fourth and fifth inverters 381 and 382, which are cascade-connected, invert the input signal IN two times (e.g., to maintain the phase of the second intermediate signal IS2) to provide the second intermediate signal IS2 to a first input (1) of the multiplexer 385. The sixth inverter 383 inverts the second intermediate signal IS2 to provide an inverted second intermediate signal to a second input (0) of the multiplexer 385.

When the control signal CTL has a first logic level, the multiplexer 385 may provide the output of the fifth inverter 382 as the output signal OUT, and when the control signal CTL has a second logic level, the multiplexer 385 may provide the output of the sixth inverter 383 as the output signal OUT.

In FIG. 7, the fourth and fifth inverters 381 and 382 and the first input (1) of the multiplexer 385 through which the second intermediate signal IS2 passes when the control signal CTL has a first logic level may be referred to as an non-inversion path. In addition, the sixth inverter 383 and the second input (0) of the multiplexer 385 through which the second intermediate signal IS2 passes when the control signal CTL has a second logic level may be referred to as an inversion path.

As is noted from FIGS. 6 and 7, the input signal IN is provided as the output signal OUT through three inverters and two multiplexers in the first and second phase converters 360a and 380a when the control signal CTL has a first logic level.

Figure 8:
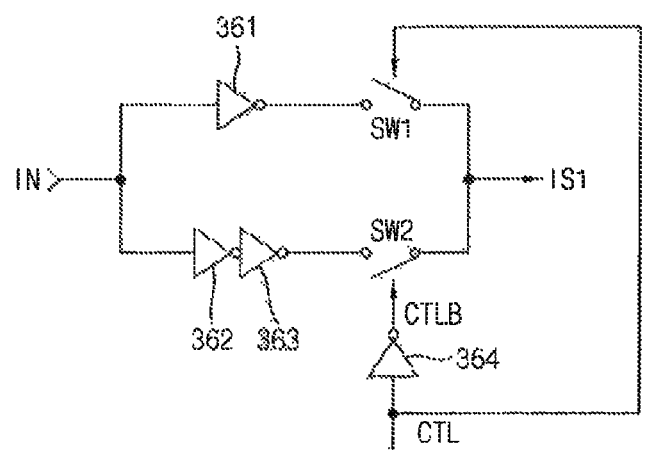
FIG. 8 is a circuit diagram illustrating a first phase converter in the delay circuit of FIG. 3 according to an exemplary embodiment of the inventive concept.

FIG. 8 is a circuit diagram illustrating the first phase converter in the delay circuit of FIG. 3 according to an exemplary embodiment of the inventive concept.

Referring to FIG. 8, a first phase converter 360b may include a first inverter 361, second and third inverters 362 and 363, first and second switches SW1 and SW2 and an inverter 364.

The first phase converter 360b of FIG. 8 differs from the first phase converter 360a of FIG. 6 in that the first and second switches SW1 and SW2 and the inverter 364 replace the multiplexer 365.

The inverter 364 inverts the control signal CTL to provide the second switch SW2 with an inverted control signal CTLB which has a reverse phase with respect to a phase of the control signal CTL. When the control signal CTL has a first logic level, the first switch SW1 is connected, the second switch SW2 is disconnected and the output of the first inverter 361 is provided as the first intermediate signal IS1. When the control signal CTL has a second logic level, the first switch SW1 is disconnected, the second switch SW2 is connected and the output of the third inverter 363 is provided as the first intermediate signal IS1.

Figure 9:
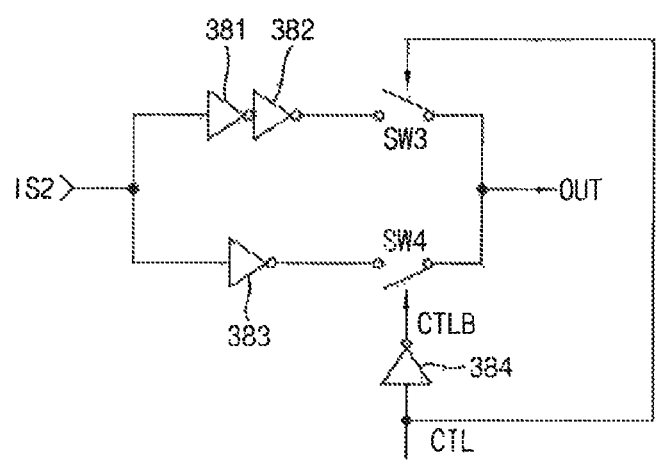
FIG. 9 is a circuit diagram illustrating a second phase converter in the delay circuit of FIG. 3 according to an exemplary embodiment of the inventive concept.

FIG. 9 is a circuit diagram illustrating the second phase converter in the delay circuit of FIG. 3 according to an exemplary embodiment of the inventive concept.

Referring to FIG. 9, a second phase converter 380b may include fourth and fifth inverters 381 and 382, a sixth inverter 383, third and fourth switches SW3 and SW4 and an inverter 384.

The second phase converter 380b of FIG. 9 differs from the second phase converter 380a of FIG. 7 in that the third and fourth switches SW3 and SW4 and the inverter 384 replace the multiplexer 385.

The inverter 384 inverts the control signal CTL to provide the fourth switch SW4 with an inverted control signal CTLB which has a reverse phase with respect to a phase of the control signal CTL. When the control signal CTL has a first logic level, the third switch SW3 is connected, the fourth switch SW4 is disconnected and the output of the fifth inverter 382 is provided as the output signal OUT. When the control signal CTL has a second logic level, the third switch SW3 is disconnected, the fourth switch SW4 is connected and the output of the sixth inverter 383 is provided as the output signal OUT.

Figure 10:
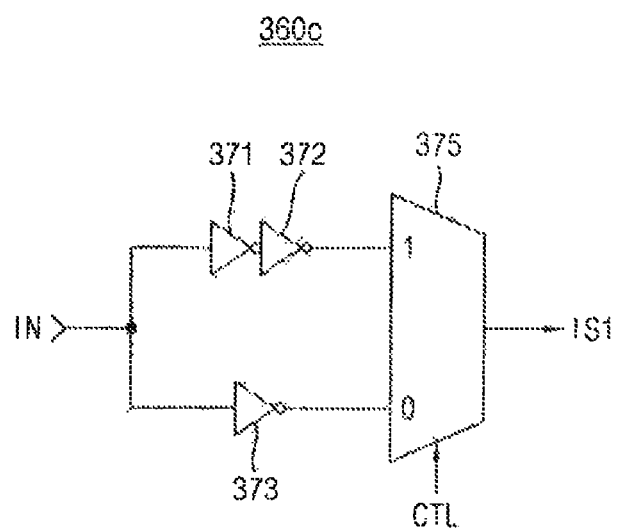
FIG. 10 is a circuit diagram illustrating a first phase converter in the delay circuit of FIG. 3 according to an exemplary embodiment of the inventive concept.

FIG. 10 is a circuit diagram illustrating the first phase converter in the delay circuit of FIG. 3 according to an exemplary embodiment of the inventive concept.

Referring to FIG. 10, a first phase converter 360c may include two inverters 371 and 372 which are cascade-connected, an inverter 373 and a multiplexer 375.

The inverters 371 and 372 invert the input signal IN two times to provide the input signal IN to a first input (1) of the multiplexer 375. The inverter 373 inverts the input signal IN to provide an inverted input signal to a second input (0) of the multiplexer 375.

Figure 11:
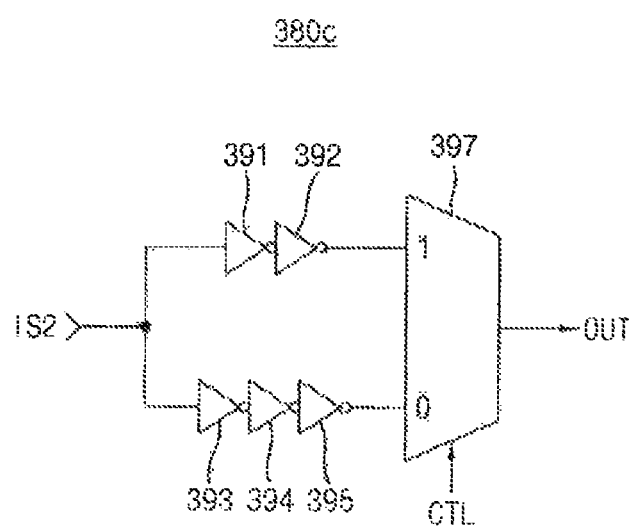
FIG. 11 is a circuit diagram illustrating a second phase converter in the delay circuit of FIG. 3 according to an exemplary embodiment of the inventive concept.

FIG. 11 is a circuit diagram illustrating the second phase converter in the delay circuit of FIG. 3 according to an exemplary embodiment of the inventive concept.

Referring to FIG. 11, a second phase converter 380c may include two inverters 391 and 392 which are cascade-connected, three inverters 393, 394 and 395 which are cascade-connected and a multiplexer 397.

The inverters 391 and 392 invert the second intermediate signal IS2 two times to provide the second intermediate signal IS2 as the input signal IN to a first input (1) of the multiplexer 397. The inverters 393, 394 and 395 invert the second intermediate signal IS2 three times to provide an inverted second intermediate signal to a second input (0) of the multiplexer 397.

As is noted from FIGS. 10 and 11, the input signal IN is provided as the output signal OUT through four inverters and two multiplexers in the first and second phase converters 360c and 380c when the control signal CTL has a first logic level.

Figure 12:
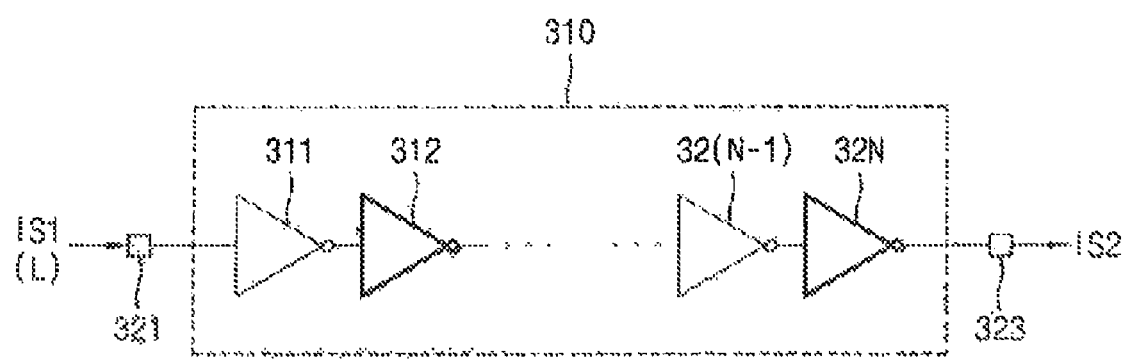
FIGS. 12 and 13 illustrate an operation of a delay chain in FIG. 3 according to an exemplary embodiment of the inventive concept.
Figure 13:
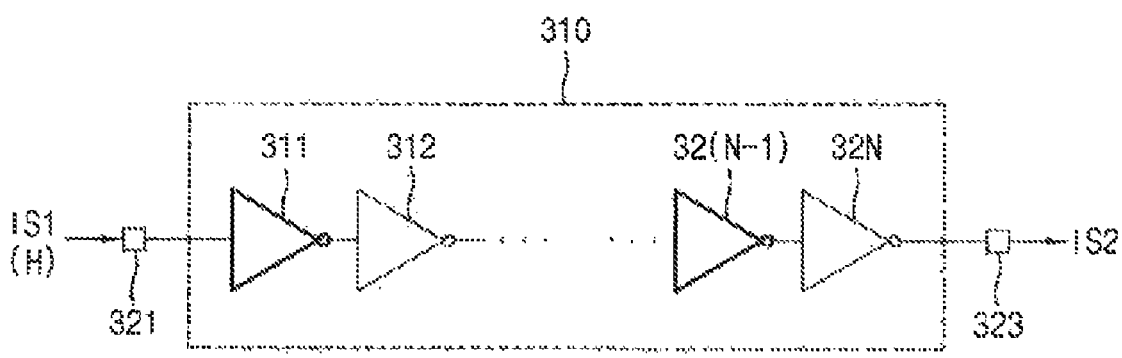

FIGS. 12 and 13 illustrate operation of the delay chain in FIG. 3 according to an exemplary embodiment of the inventive concept. In particular, FIGS. 12 and 13 illustrate the delay chain in FIG. 3 operating according to a logic level of the control signal.

Referring to FIGS. 6, 7 and 12, when the input signal IN has a logic high level, and the control signal CTL has a first logic level (high level), the input signal IN is inverted in the first phase converter 360a and the first intermediate signal IS1 having a second logic level (low level) is applied to the delay chain 310. Therefore, a signal having a high level is applied to each PMOS transistor of even-numbered delay cells 312, . . . , 32N of the 2N delay cells 311~32N.

Referring to FIGS. 6, 7 and 13, when the input signal IN has a logic high level, and the control signal CTL has a second logic level (low level), the input signal IN is maintained in the first phase converter 360a and the first intermediate signal IS1 having a first logic level (high level) is applied to the delay chain 310. Therefore, a signal having a high level is applied to each PMOS transistor of odd-numbered delay cells 311, . . . , 32(N−1) of the 2N delay cells 311~32N.

As is noted from FIGS. 12 and 13, the first phase converter 360 alternatingly changes the phase of the input signal IN when the logic level of the control signal CTL is changed. Therefore, when the logic level of the control signal CTL is changed, certain delay cells of the 2N delay cells 311~32N receive a signal having a high level while others do not. Therefore, transistor degradation due to NBTI effects may be reduced by the delay cell 310.

Figure 14:
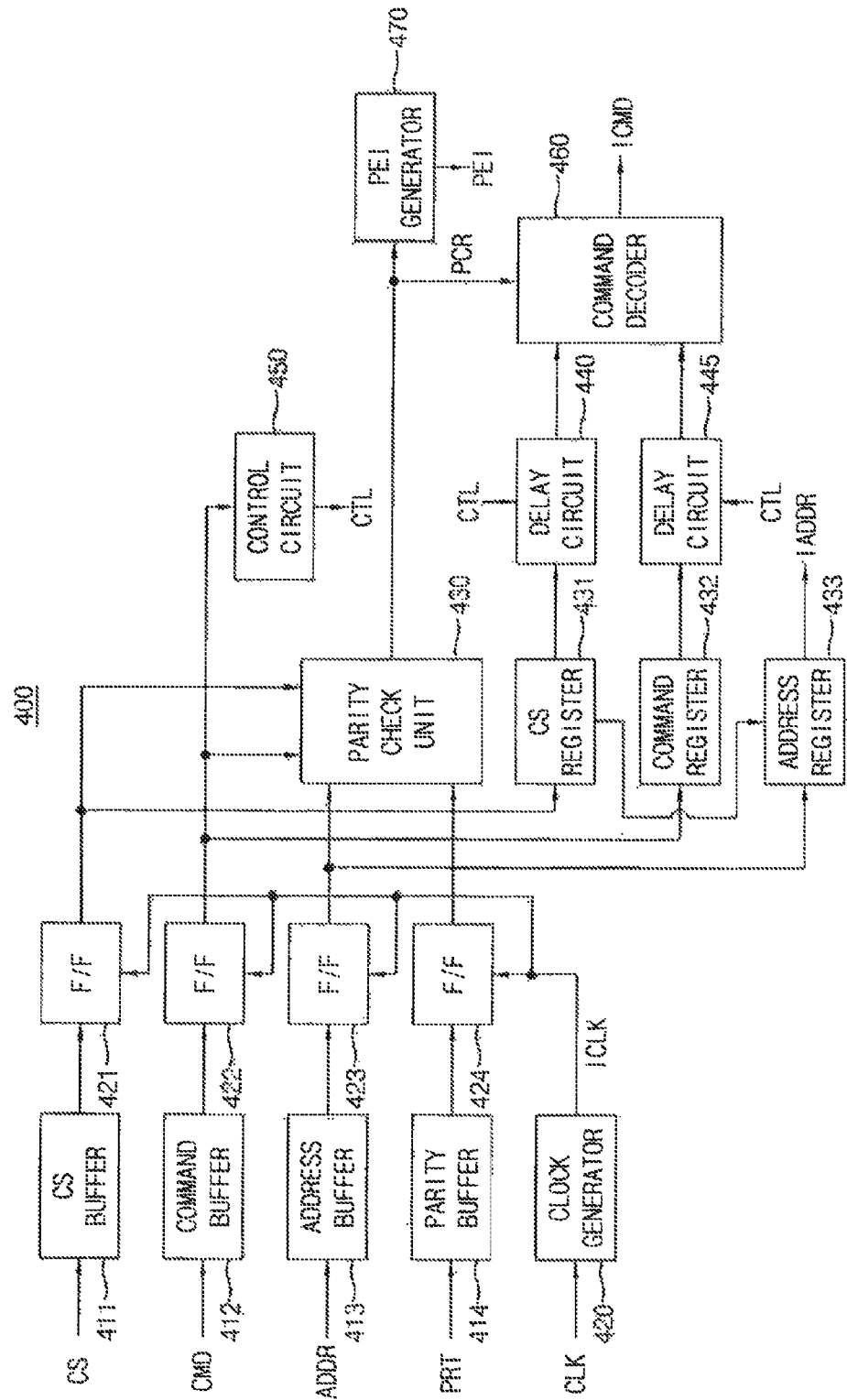
FIG. 14 is a block diagram illustrating a semiconductor memory device according to an exemplary embodiment of the inventive concept.

FIG. 14 is a block diagram illustrating a semiconductor memory device according to an exemplary embodiment of the inventive concept.

Referring to FIG. 14, a semiconductor memory device 400 includes buffers 411~414, a clock generator 420, flip flops 421~424, a parity check unit 430, registers 431~433, delay circuits 440 and 445, a control circuit 450, a command decoder 460 and an information generator 470.

A first buffer 411 stores a chip selection signal CS, a second buffer 412 stores the command CMD, a third buffer 413 stores the address ADDR and a fourth buffer 414 stores the parity signal PRT.

The clock generator 420 receives an external clock signal CLK to generate an internal clock signal ICLK. The clock generator 420 may include a delay-locked loop circuit that synchronizes the internal clock signal ICLK with the external clock signal CLK.

A first flip flop 421 is connected to the first buffer 411, stores the chip selection signal CS and provides the chip selection signal CS to the parity check unit 430 and a first register 431 in synchronization with the internal clock signal ICLK.

A second flip flop 422 is connected to the second buffer 412, stores the command CMD and provides the command CMD to the parity check unit 430, a second register 432 and the control circuit 450 in synchronization with the internal clock signal ICLK.

A third flip flop 423 is connected to the third buffer 413, stores the address ADDR and provides the address ADDR to the parity check unit 430 and a third register 433 in synchronization with the internal clock signal ICLK.

A fourth flip flop 424 is connected to the fourth buffer 414, stores the parity signal PRT and provides the parity signal PRT to the parity check unit 430 in synchronization with the internal clock signal ICLK.

Although it is illustrated in FIG. 14 that the parity check unit 430 performs a parity check operation on the address ADDR, the address ADDR may further include a bank address and a bank group address when the semiconductor memory device 400 includes a plurality of banks grouped into bank groups.

As described with reference to FIG. 2, the parity check unit 430 performs a parity check operation with respect to the command CMD and the address ADDR synchronized with the internal clock signal ICLK. The parity check unit 430 does this by using, for example, bit values of bits included in the command CMD and the address ADDR as well as a bit value of the parity signal PRT. The parity check result PCR is provided to the information generator 470, and the information generator 470 generates parity error information PEI indicating whether a parity error is generated by using the parity check result PCR and outputs the parity error information PEI to an external memory controller.

In addition, the parity check result PCR is also provided to the command decoder 460. The command decoder 460 may generate an internal command ICMD or block output of the internal command ICMD according to the parity check result PCR.

The delay circuits 440 and 445 may delay timings of providing the chip selection signal CS and the command CMD to the command decoder 460 respectively, in response to the control signal CTL in time synchronization with the parity check result PCR when the parity check result PCR is provided to the command decoder 460. Each of the delay circuit circuits 440 and 445 may employ the delay circuit 300 of FIG. 3.

The control circuit 450 may invert a logic level of the control signal CTL when the command CMD is applied to the control circuit 450. The control circuit 450 may employ the control circuit 160 of FIG. 5.

The third register (or an address register) 433 receives the address ADDR from the third flip flop 423, generates an internal address IADDR and outputs the internal address IADDR. A delay circuit may be coupled to the third register 433, and the delay circuit delays the internal address IADDR such that the internal address IADDR is output in time synchronization with the internal command ICMD.

Figure 15:
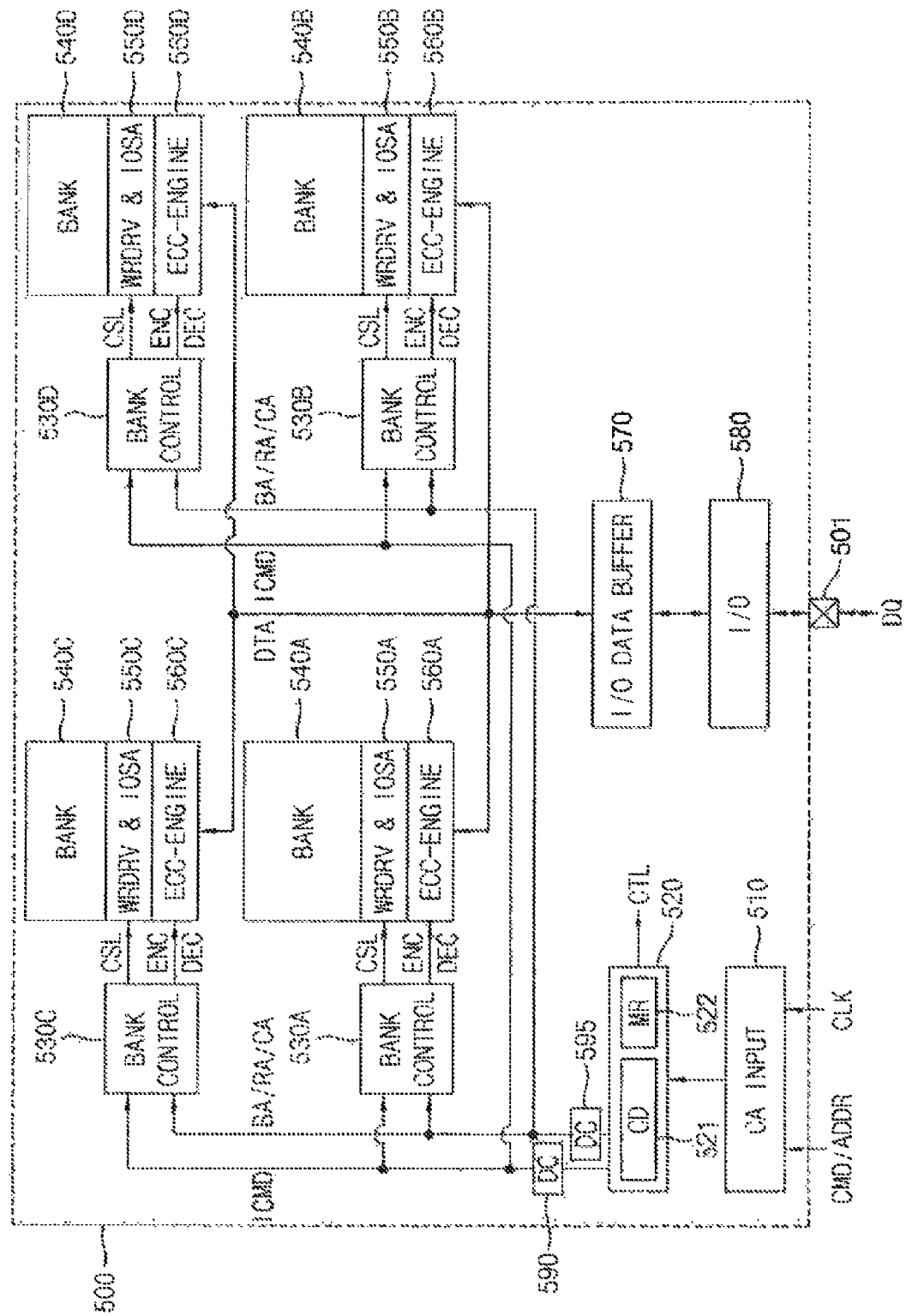
FIG. 15 is a block diagram illustrating a semiconductor memory device according to an exemplary embodiment of the inventive concept.

FIG. 15 is a block diagram illustrating a semiconductor memory device according to an exemplary embodiment of the inventive concept.

Referring to FIG. 15, a semiconductor memory device 500 may include a command/address input buffer 510, a control logic circuit 520, bank control logics 530A~530D, a memory cell array 540A~540D, write driver and data input/output (I/O) sense amplifiers 550A~550D, error correction code (ECC) engines 560A~560D, an I/O data buffer 570, an I/O circuit 580 and one or more delay circuits 590 and 595.

The memory cell array 540A~540D may include first through fourth bank arrays 540A~540D, respectively, in which a plurality of memory cells are arranged in rows and columns. A row decoder and a column decoder for selecting word-lines and bit-lines that are connected to the memory cells may be connected to each of the first through fourth bank arrays 540A~540D. In the present exemplary embodiment, the semiconductor memory device 500 includes four banks, but in other embodiments, the semiconductor memory device 500 may include more or less banks.

The command/address input buffer 510 may receive a clock signal CLK, a command CMD, and an address ADDR from an external memory controller. The command CMD and the address ADDR may be input via the same terminals, e.g., CA pads. The command CMD and the address ADDR may be sequentially input via the CA pads. The command CMD issued by the memory controller may include a read command, a write command and an impedance calibration command. The read command indicates a read operation of the semiconductor memory device 500, and the write command indicates a write operation of the semiconductor memory device 500.

The control logic circuit 520 may receive the command CMD and the address ADDR via the command/address input buffer 510, and may generate an internal command ICMD, a control signal CTL and an address signal. The internal command ICMD may include an internal read command and an internal write command. The address signal may include a bank address BA, a row address RA, and a column address CA. The internal command ICMD and the address signal BA/RA/CA may be provided to each of the bank control logics 530A~530D. The control logic circuit 520 may control access to the memory cell arrays 540A~540D.

The control logic circuit 520 may include a command decoder 521 and a mode register 522. The command decoder 521 decodes the command CMD to generate the internal command ICMD and the mode register 522 may set an operation mode of the semiconductor memory device 500 based on the command CMD and the address ADDR.

The control logic circuit 520 may include the control circuit 160 of FIG. 5. The control circuit may change a logic level of the control signal CTL in alternating fashion when the command CMD is applied to the control circuit. The control circuit may provide the control signal CTL to the one or more delay circuits 590 and 595.

The delay circuit 590 may be disposed in a command path through which the internal command ICMD is provided to each of the bank control logics 530A~530D. The delay circuit 590 may delay the internal command ICMD to provide the delayed internal command to each of the bank control logics 530A~530D. The delay circuit 595 may be disposed in an address path through which the address signal BA/RA/CA is provided to each of the bank control logics 530A~530D. The delay circuit 595 may delay the address signal BA/RA/CA to provide the delayed address signal to each of the bank control logics 530A~530D. Each of the delay circuits 590 and 595 may employ the delay circuit 300 of FIG. 3. Therefore, each of the delay circuits 590 and 595 may change which delay cells of 2N delay cells receive a signal having a high level when the logic level of the control signal CTL is changed. For example, odd delay cells may receive the signal having a high level, then even delay cells may receive the signal having a high level, then the odd delay cells may receive the signal having the high level, and so forth. Therefore, each of the delay circuits 590 and 595 may disperse degradation of a transistor due to NBTI effects, and thus, signal integrity in the semiconductor memory device 500 may be increased.

At least one delay circuit may be disposed in a data path between the I/O data buffer 570 and each of the ECC engines 560A~560D, and at the one delay circuit may perform the above-described operations in response to the control signal CTL.

Each of the bank control logics 530A~530D may be activated by correspond bank addresses BA. The activated bank control logics 530A~530D may generate bank control signals in response to the internal command ICMD, the row address RA, and the column address CA. In response to a bank control signal, the row decoder and the column decoder of each of the first through fourth bank arrays 540A~540D that are connected to the activated bank control logics 530A~530D may be activated.

The row decoder of each of the first through fourth bank arrays 540A~540D may decode the row address RA and therefore may enable a word-line that corresponds to the row address RA. The column address CA of each of the first through fourth bank arrays 540A~540D may be temporarily stored in a column address latch. The column address latch may stepwise increase the column address CA in a burst mode. The temporarily stored or stepwise increased column address CA may be provided to the column decoder. The column decoder may decode the column address CA and therefore may activate a column selection signal CSL that corresponds to the column address CA.

In response to the bank control signal, each of the bank control logics 530A~530D may generate an ECC encoding signal ENC and an ECC decoding signal DEC for controlling operations of the ECC engines 560A~560D that are connected to the first through fourth bank arrays 540A~540D, respectively.

The write driver and data I/O sense amplifiers 550A~550D may sense and amplify a plurality of pieces of read data output from the first through fourth bank arrays 540A~540D, respectively, and may transmit a plurality of pieces of write data to be stored in the first through fourth bank arrays 540A~540D, respectively.

During a write operation, each of the ECC engines 560A~560D may generate parity bits by performing an ECC encoding operation on the plurality of pieces of write data to be stored in each of the first through fourth bank arrays 540A~540D, in response to the ECC encoding signal ENC output from each of the bank control logics 530A~530D.

During a read operation, each of the ECC engines 560A~560D may perform an ECC decoding operation by using the plurality of pieces of data and parity bits that are read from each of the first through fourth bank arrays 540A~540D, in response to the ECC decoding signal DEC output from each of the first through fourth bank arrays 540A~540D, and therefore may detect and correct an error bit occurred in the plurality of pieces of read data.

The I/O data buffer 570 may include circuits for gating a plurality of pieces of data that are input to or output from the first through fourth bank arrays 540A~540D; read data latches for storing the plurality of pieces of data output from the first through fourth bank arrays 540A~540D; and write data latches for writing the plurality of pieces of data to the first through fourth bank arrays 540A~540D.

The I/O data buffer 570 may convert parallel data bits that are output from the first through fourth bank arrays 540A~540D into serial data bits via the read data latches. The I/O data buffer 570 may convert a plurality of pieces of write data that are serially received into parallel data bits by using the write data latches.

The I/O circuit 580 may receive the serial data bits output from the I/O data buffer 570, may sequentially arrange the serial data bits as data bits that correspond to a burst length, and then, may output the data bits together with the data strobe signal DQS to data I/O pads. The I/O circuit 580 may receive the data strobe signal DQS and the plurality of pieces of write data that correspond to the burst length, wherein the data strobe signal DQS and the pieces of write data are serially input via the data I/O pads (e.g., 501) from the memory controller. The I/O circuit 580 may provide, to the I/O data buffer 570, the plurality of pieces of serially input write data that correspond to the burst length.

In FIG. 15, at least one delay circuit may be disposed in one of a command path through which the command CMD is delivered, the address path through which the address ADDR is delivered and a data path through which the data DQ or the data DTA is delivered in the semiconductor memory device 500.

Figure 16:
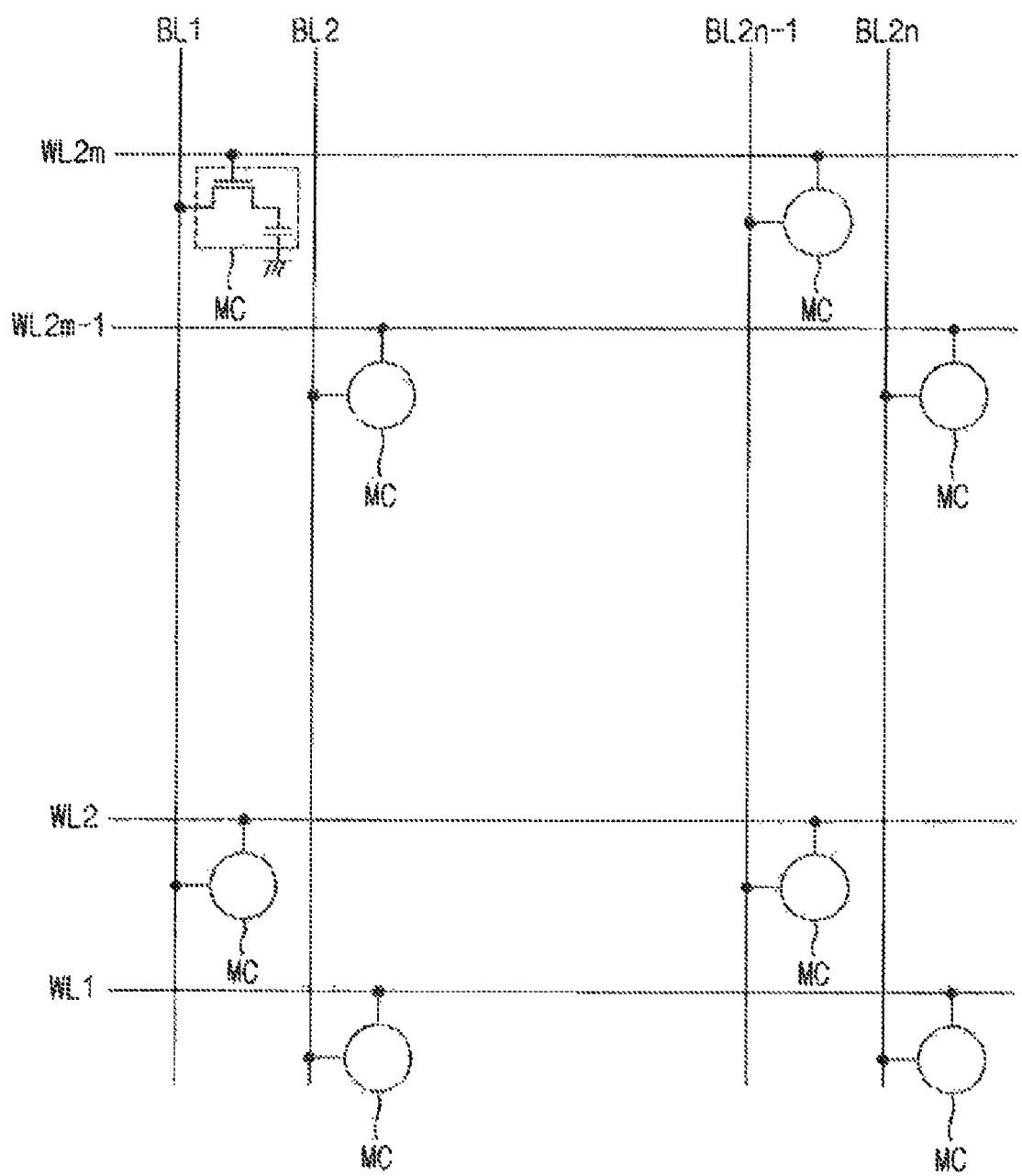
FIG. 16 illustrates a first bank array in the semiconductor memory device of FIG. 15 according to an exemplary embodiment of the inventive concept.

FIG. 16 illustrates the first bank array in the semiconductor memory device of FIG. 15 according to an exemplary embodiment of the inventive concept.

Referring to FIG. 16, the first bank array 540A includes a plurality of word-lines WL1~WL2$m$ ($m$ is a natural number greater than two), a plurality of bit-lines BL1~BL2$n$ ($n$ is a natural number greater than two), and a plurality of memory cells MCs disposed near intersections between the word-lines WL1~WL2$m$ and the bit-lines BL1~BL2$n$. In an exemplary embodiment of the inventive concept, each of the plurality of memory cells MCs may include a dynamic random access memory (DRAM) cell structure. The plurality of word-lines WL1~WL2$m$ to which the plurality of memory cells MCs are connected may correspond to rows of the first bank array 540A and the plurality of bit-lines BL1~BL2$n$ to which the plurality of memory cells MCs are connected may correspond to columns of the first bank array 540A.

In FIG. 16, $m$ memory cells are coupled to a bit-line BL of the first bank array 540A and $m$ memory cells are coupled to a word-line of the first bank array 540A.

A resistive type memory cell is coupled to a bit-line BL and a word-line in the first bank array 540A. The resistive type memory cell may include a spin transfer torque (STT)-magnetic random access memory (MRAM). The semiconductor memory device 500 may bean MRAM, a resistive random access memory (RRAM), a phase change random access memory (PRAM) or a ferroelectric random access memory (FRAM).

An MRAM is a nonvolatile computer memory based on magnetoresistance. Since an MRAM is nonvolatile, the MRAM may retain all stored data even when power is turned off.

An MRAM has read and write response times comparable with read and write response times of a volatile RAM. An MRAM stores data by using magnetoresistance elements. A magnetoresistance element of an MRAM is made of two magnetic layers each having magnetization.

An MRAM is a nonvolatile memory device that reads and writes data by using a magnetic tunnel junction pattern including two magnetic layers and an insulating film disposed between the two magnetic layers. A resistance value of the magnetic tunnel junction pattern may vary according to a magnetization direction of each of the magnetic layers. The MRAM may program or remove data by using the variation of the resistance value.

An STT-MRAM uses a method in which when a spin-polarized current flows in one direction, a magnetization direction of the magnetic layer is changed due to the spin transfer of electrons. A magnetization direction of one magnetic layer (e.g., a pinned layer) may be fixed and a magnetization direction of the other magnetic layer (e.g., a free layer) may vary according to a magnetic field generated by a program current.

The magnetic field of the program current may arrange the magnetization directions of the two magnetic layers in parallel or anti-parallel. For example, if the magnetization directions of the two magnetic layers are parallel, a resistance between the two magnetic layers is in a low ("0") state. If the magnetization directions of the two magnetic layers are anti-parallel, a resistance between the two magnetic layers is in a high ("1") state. Switching of the magnetization direction of the free layer and the high or low state of the resistance between the two magnetic layers results in write and read operations of the MRAM.

Although the MRAM is nonvolatile and provides a quick response time, an MRAM cell has a limited scale and is sensitive to write disturbance. The program current applied to switch the high and low states of the resistance between the magnetic layers of the MRAM is typically high. Accordingly, when a plurality of cells are arranged in an MRAM array, a program current applied to one memory cell changes a magnetic field of a free layer of an adjacent cell. Such a write disturbance may be prevented by using an STT phenomenon. A typical STT-MRAM may include a magnetic tunnel junction (MTJ) element, which is a magnetoresistive data storage device including two magnetic layers (a pinned layer and a free layer) and an insulating layer disposed between the two magnetic layers.

A program current typically flows through the MTJ element. The pinned layer spin-polarizes electrons of the program current, and a torque is generated as the spin-polarized electron current passes through the MTJ element. The spin-polarized electron current applies the torque to the free layer while interacting with the free layer. When the torque of the spin-polarized electron current passing through the MTJ element is greater than a threshold switching current density, the torque applied by the spin-polarized electron current is sufficient to switch a magnetization direction of the free layer. Accordingly, the magnetization direction of the free layer may be parallel or anti-parallel to the pinned layer and a resistance state in the MTJ element is changed.

The STT-MRAM removes a requirement of an external magnetic field for the spin-polarized electron current to switch the free layer in the magnetoresistive device. In addition, the STT-MRAM improves scaling as a cell size is reduced and the program current is reduced, and prevents the write disturbance. In addition, the STT-MRAM may have a high tunnel magnetoresistance ratio, and improves a read operation in a magnetic domain by allowing a high ratio between the high and low states.

An MRAM is an all-round memory device that is low cost and has high capacity (like a DRAM, operates at high speed (like a static random access memory (SRAM), and is non-volatile (like a flash memory).

Figure 17:
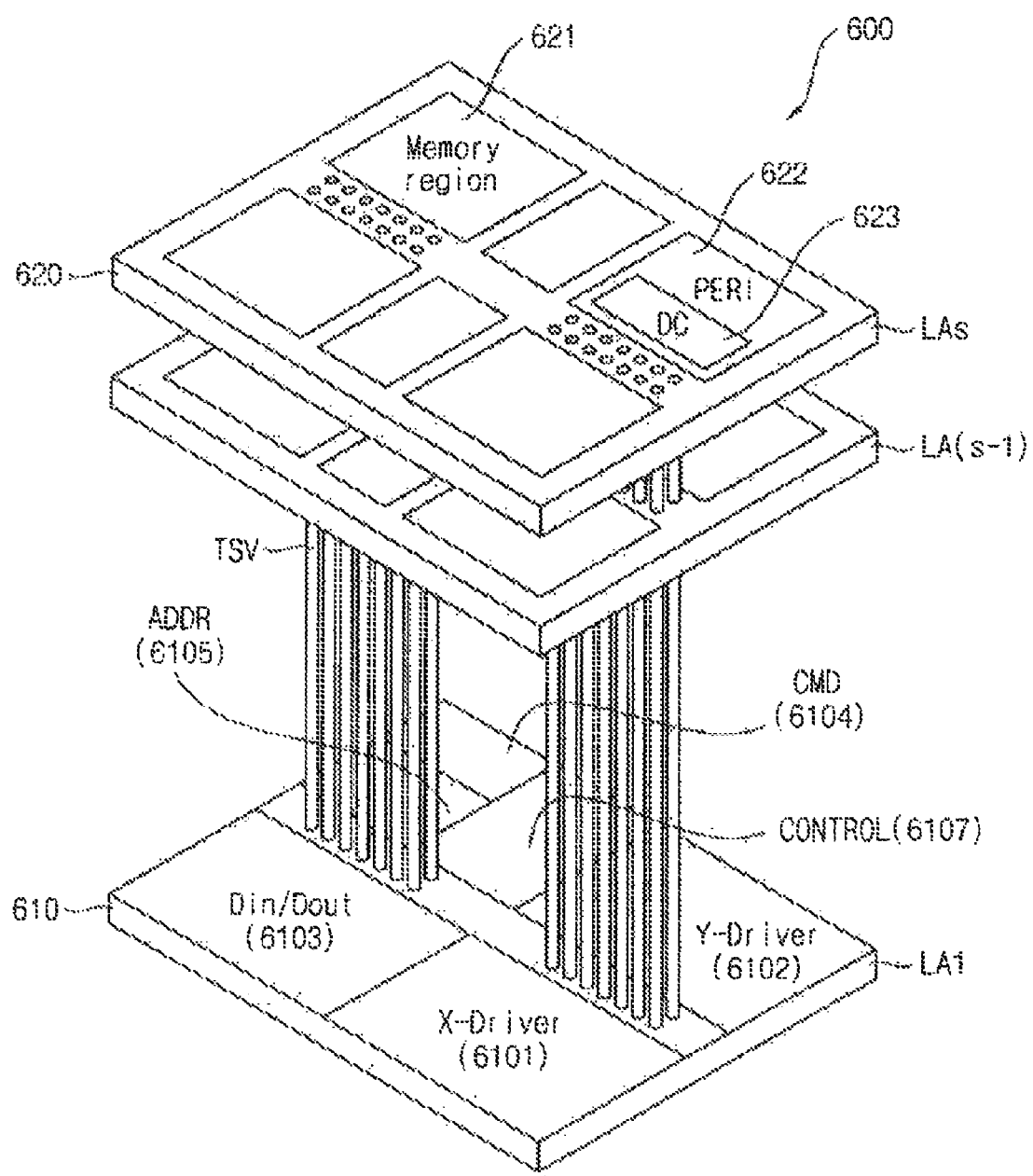
FIG. 17 is a structural diagram illustrating a semiconductor memory device according to an exemplary embodiment of the inventive concept.

FIG. 17 is a structural diagram illustrating a semiconductor memory device according to an exemplary embodiment of the inventive concept.

Referring to FIG. 17, a semiconductor memory device 600 may include first through sth semiconductor integrated circuit layers LA1 through Las (s is a natural number greater than two), in which the lowest first semiconductor integrated circuit layer LA1 is an interface or control chip and the other semiconductor integrated circuit layers LA2 through LAs are slave chips including core memory chips. The first through nth semiconductor integrated circuit layers LA1 through LAs may transmit and receive signals therebetween through through-silicon-vias (TSVs). The lowest first semiconductor integrated circuit layer LA1 as the interface or control chip may communicate with an external memory controller through a conductive structure formed on an external surface. A description will be made regarding the structure and an operation of the semiconductor memory device 600 by mainly using the first semiconductor integrated circuit layer LA1 or 610 as the interface or control chip and the s-th semiconductor integrated circuit layer LAs or 620 as the slave chip.

The first semiconductor integrated circuit layer 610 may include various peripheral circuits for driving a memory region 621 provided in the s-th semiconductor integrated circuit layer 620. For example, the first semiconductor integrated circuit layer 610 may include a row (X)-driver 6101 for driving word-lines of a memory, a column (Y)-driver 6102 for driving bit lines of the memory, a data I/O circuit (Din/Dout) 6103 for controlling input/output of data, a command buffer (CMD) 6104 for receiving a command CMD from outside and buffering the command CMD, and an address buffer (ADDR) 6105 for receiving an address from outside and buffering the address. The memory region 621 may include a plurality of memory cells like those shown and described with reference to FIG. 16.

The first semiconductor integrated circuit layer 610 may further include a control logic 6107. The control logic 6107 may control an access to the memory region 621 based on a command and an address signal from an external memory controller.

The s-th semiconductor integrated circuit layer 620 may include the memory region 621 and a peripheral circuit region 622 in which peripheral circuits for reading/writing data of the memory region 621, e.g., a row decoder, a column decoder, a bit line sense amplifier, etc. are arranged. A delay circuit 623 may be disposed in the peripheral circuit region 622. The delay circuit 623 may employ the delay circuit 300 of FIG. 3. Therefore, the delay circuit 623 may set first delay cells of 2N delay cells to each receive a signal having a high level when the logic level of the control signal is at a first level, and then, set second delay cells of the 2N delay cells to each receive a signal having the high level when the logic level of the control signal is at a second level.

In other words, the groups of delay cells that receive high level signals are changed alternatingly when the logic level of the control signal is changed. Therefore, the delay circuit 623 may disperse degradation of a transistor due to NBTI effects, and thus, signal integrity in the semiconductor memory device 600 may be increased.

In addition, a three dimensional (3D) memory array is provided in semiconductor memory device 600. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" may mean that layers of each level of the array are directly deposited on the layers of each underlying level of the array. The following patent documents, which are incorporated by reference herein in their entireties, describe configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and U.S. Pat. Pub. No. 2011/0233648.

Figure 18:
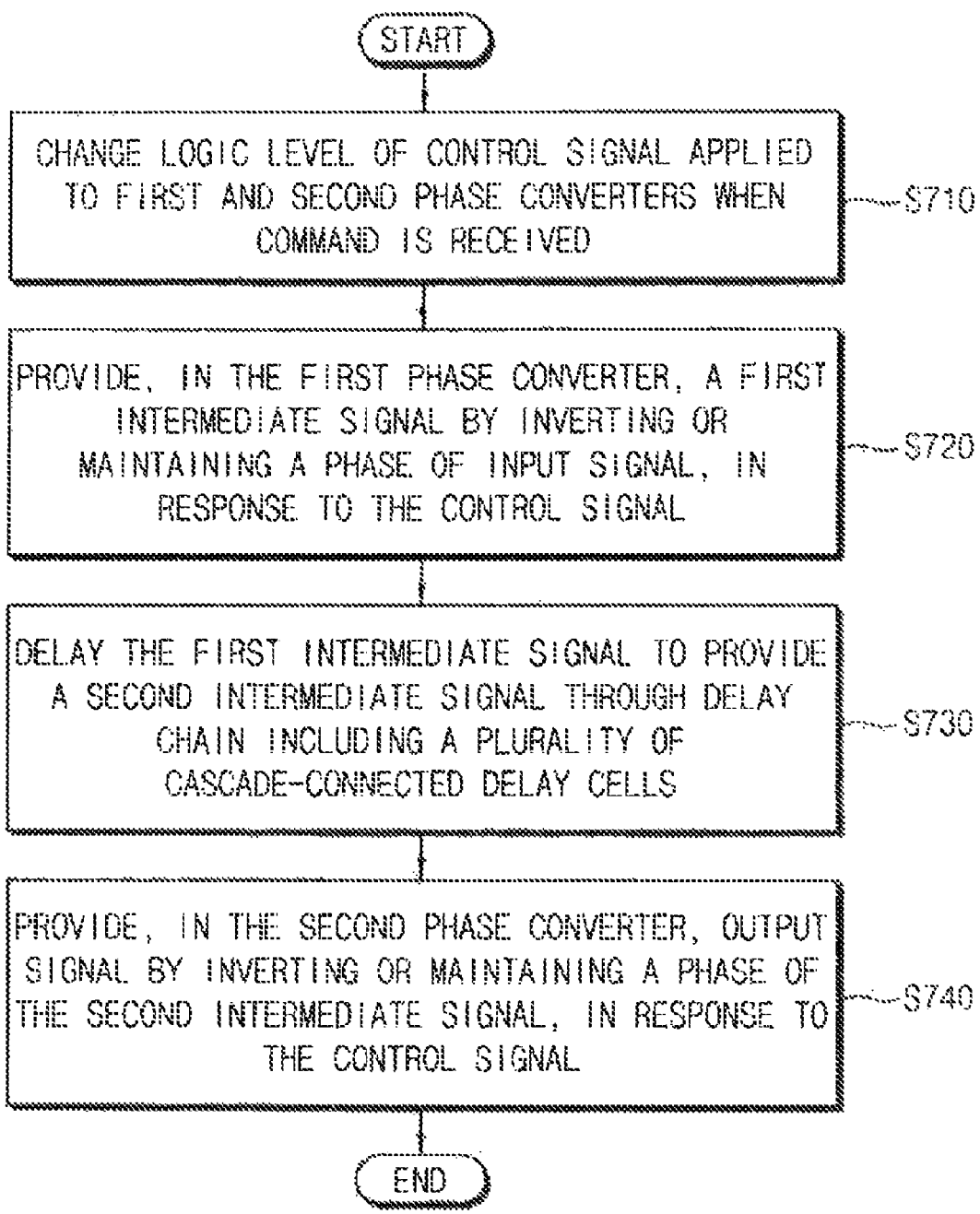
FIG. 18 is a flow chart illustrating a method of operating a semiconductor memory device according to an exemplary embodiment of the inventive concept.

FIG. 18 is a flow chart illustrating a method of operating a semiconductor memory device according to an exemplary embodiment of the inventive concept.

Referring to FIGS. 1 through 18, in a method of operating a semiconductor memory device 100 including a delay circuit 300 which includes a first phase converter 360, a delay chain 310 and a second phase converter 380 and which is disposed in one of a command path through which a command is delivered, an address path through which an address is delivered and a data path through which data is delivered in the semiconductor memory device 100, a control circuit 160 changes a logic level of a control signal CTL applied to the first phase converter 360 and the second phase converter 380 when the control circuit 160 receives the command CMD (S710). In other words, the control circuit 160 inverts a phase of the control signal CTL alternatingly whenever the command CMD is applied to the control circuit 160.

The first phase converter 360 provides a first intermediate signal IS1 by inverting or maintaining a phase of an input signal IN, in response to the control signal CTL (S720). The delay chain 310 including 2N cascade-connected delay cells 311~32N delays the first intermediate signal IS1 to provide a second intermediate signal IS2 (S730). The second phase converter 380 provides an output signal OUT by inverting or maintaining a phase of the second intermediate signal IS2, in response to the control signal CTL (S740).

As described above, the first phase converter 360 and the second phase converter 380 may operate complementarily with respect to each other in response to the control signal CTL.

Figure 19:
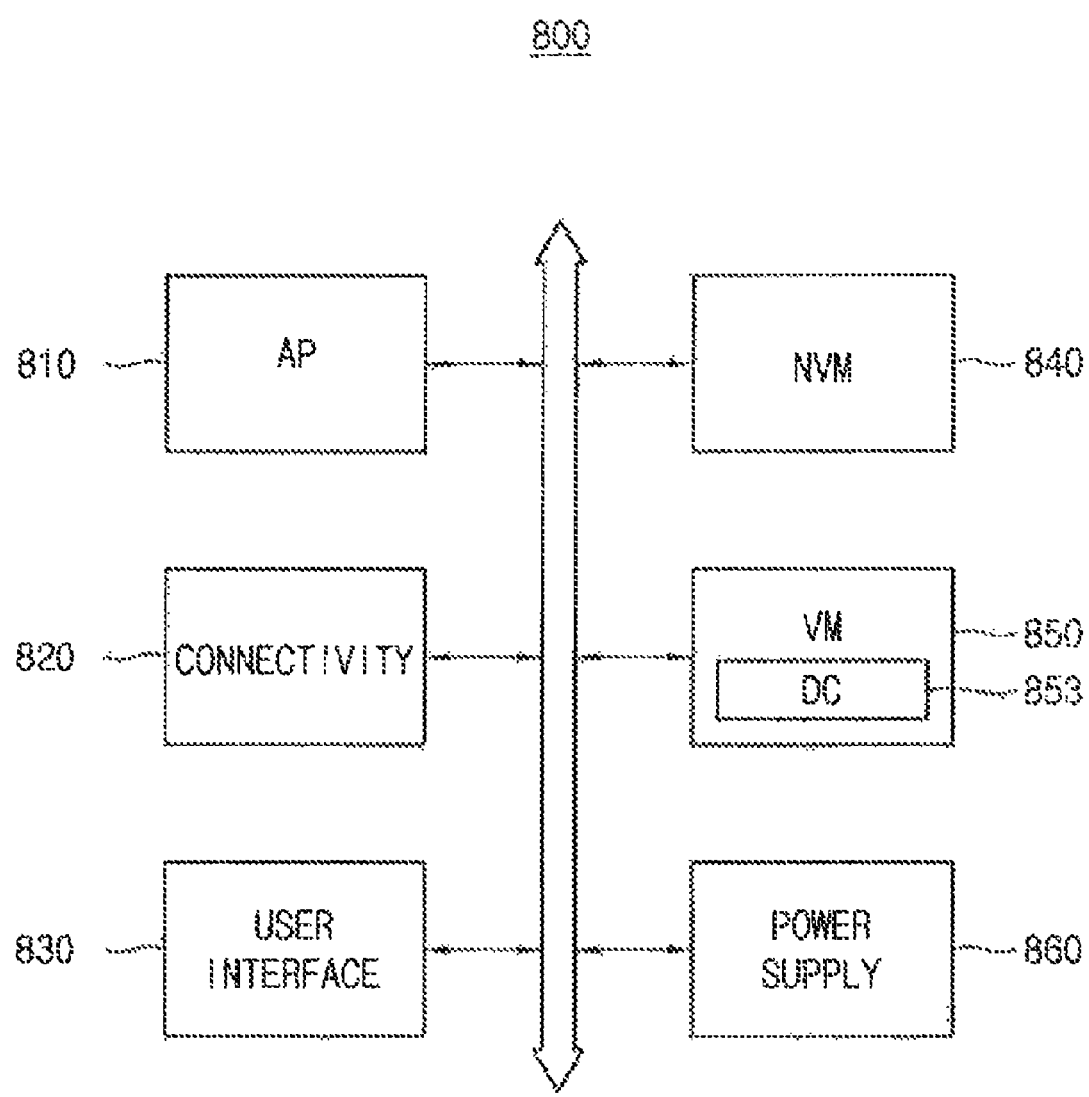
FIG. 19 is a block diagram illustrating a mobile system including a semiconductor memory device according to an exemplary embodiment of the inventive concept.

FIG. 19 is a block diagram illustrating a mobile system including a semiconductor memory device according to an exemplary embodiment of the inventive concept.

Referring to FIG. 19, a mobile system 800 may include an application processor 810, a connectivity unit 820, a user interface 830, a nonvolatile memory device 840, a volatile memory device 850 and a power supply 860.

The application processor 810 may execute applications, such as a web browser, a game application, a video player, etc. The application processor 1110 may include a single core or multiple-cores. The connectivity unit 820 may perform wired or wireless communication with an external device.

The volatile memory device 850 may store data processed by the application processor 810 or operate as a working memory. The volatile memory device 850 may include a delay circuit 853. The volatile memory device 850 may employ one of the semiconductor memory device 100 of FIG. 3, the semiconductor memory device 400 of FIG. 14 and the semiconductor memory device 500 of FIG. 15. The delay circuit 853 may include the delay circuit 300 of FIG. 3. Therefore, the delay circuit 853 may alternately change positions of delay cells of 2N delay cells, each of which receives a signal having a high level, whenever the logic level of the control signal is changed. Therefore, the delay circuit 853 may disperse degradation of a transistor due to NBTI effects, and thus, signal integrity in the volatile memory device 850 may be increased.

The nonvolatile memory device 840 may store a boot image for booting the mobile system 800. The user interface 830 may include at least one input device, such as a keypad, a touch screen, etc., and at least one output device, such as a speaker, a display device, etc. The power supply 860 may supply a power supply voltage to the mobile system 800.

In an exemplary embodiment of the inventive concept, the mobile system 800 and/or components of the mobile system 800 may be packaged in various forms.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A delay circuit of a semiconductor memory device, the delay circuit comprising:
 a delay chain connected between an input terminal and an output terminal, the delay chain including at least 2N (N is a natural number greater than two) delay cells, the delay chain configured to delay a first intermediate signal to generate a second intermediate signal;
 a first phase converter connected to the input terminal, the first phase converter configured to provide the first intermediate signal to the delay chain, wherein the first intermediate signal is generated by inverting a phase of an input signal or by maintaining the phase of the input signal in response to a control signal; and
 a second phase converter connected to the output terminal, the second phase converter configured to generate an output signal by inverting a phase of the second intermediate signal or by maintaining the phase of the second intermediate signal in response to the control signal.

2. The delay circuit of claim 1, further comprising:
 a control circuit configured to generate the control signal in response to a command,
 wherein the control circuit is configured to change a logic level of the control signal when the command is input to the control circuit.

3. The delay circuit of claim 2, wherein the control circuit comprises:
 a command detector configured to generate a detection signal in response to the command; and
 a control signal generator configured to change the logic level of the control signal when the detection signal is generated.

4. The delay circuit of claim 1, wherein the first phase converter and the second phase converter operate complementarily with respect to each other in response to the control signal.

5. The delay circuit of claim 1, wherein the at least 2N delay cells comprises 2N inverters which are cascade-connected, and
wherein each of the 2N inverters comprises:
a p-channel metal oxide semiconductor (PMOS) transistor connected to a power supply voltage; and
an n-channel metal oxide semiconductor (NMOS) transistor connected between the PMOS transistor and a ground voltage.

6. The delay circuit of claim 5, wherein when the control signal has a first logic level, the first phase converter is configured to invert the phase of the input signal to generate the first intermediate signal and the second phase converter is configured to maintain the phase of the second intermediate signal to generate the output signal.

7. The delay circuit of claim 6, wherein when the control signal has the first logic level, each gate of the PMOS transistors of even-numbered inverters of the 2N inverters receives a signal having the first logic level.

8. The delay circuit of claim 5, wherein when the control signal has a second logic level different from a first logic level, the first phase converter is configured to maintain the phase of the input signal to generate the first intermediate signal and the second phase converter is configured to invert the phase of the second intermediate signal to generate the output signal.

9. The delay circuit of claim 8, wherein when the control signal has the second logic level, each gate of the PMOS transistors of odd-numbered inverters of the 2N inverters receives a signal having the first logic level.

10. The delay circuit of claim 1, wherein the first phase converter comprises:
a first inverter, connected to the input terminal, and configured to invert the phase of the input signal at least once;
second and third inverters configured to invert the phase of the input signal at least two times, wherein the second and third inverters are cascade-connected to the input terminal; and
a first multiplexer configured to provide one of an output of the first inverter and an output of the third inverter as the first intermediate signal, in response to the control signal.

11. The delay circuit of claim 10, wherein the second phase converter comprises:
fourth and fifth inverters configured to invert the phase of the second intermediate signal at least two times, wherein the fourth and fifth inverters are cascade-connected to the output terminal;
a sixth inverter, connected to the output terminal, and configured to invert the phase of the second intermediate signal at least once; and
a second multiplexer configured to provide one of an output of the fifth inverter and an output of the sixth inverter as the output signal, in response to the control signal.

12. The delay circuit of claim 1, wherein the delay circuit is configured to change which of the 2N delay cells receives a signal having a high logic level when the control signal is applied to the delay circuit.

13. A semiconductor memory device, comprising:
a memory cell array including a plurality of memory cells coupled to a plurality of word-lines and a plurality of bit-lines;
a control logic circuit configured to control an access to the memory cell array in response to a command and an address; and
a delay circuit disposed along a command path, an address path or a data path of the semiconductor memory device,
wherein the command is provided through the command path, the address is provided through the address path and data is provided to the memory cell array through the data path, and
wherein the delay circuit comprises:
a delay chain connected between an input terminal and an output terminal, the delay chain including at least 2N (N is a natural number greater than two) delay cells, the delay chain configured to delay a first intermediate signal to generate a second intermediate signal;
a first phase converter connected to the input terminal, the first phase converter configured to provide the first intermediate signal to the delay chain, wherein the first intermediate signal is generated by inverting a phase of an input signal or by maintaining the phase of the input signal in response to a control signal; and
a second phase converter connected to the output terminal, the second phase converter configured to generate an output signal by inverting a phase of the second intermediate signal or by maintaining the phase of the second intermediate signal in response to the control signal.

14. The semiconductor memory device of claim 13, wherein the control logic circuit is configured to change a logic level of the control signal when the command is input to the control logic circuit.

15. The semiconductor memory device of claim 13, wherein the memory cell array includes a three-dimensional memory cell array.

16. The semiconductor memory device of claim 13, wherein each of the plurality of memory cells is a dynamic random access memory cell.

17. The semiconductor memory device of claim 13, wherein each of the plurality of memory cells is a resistive type memory cell.

18. A delay circuit of a semiconductor memory device, the delay circuit comprising:
a first phase converter configured to receive an input signal and generate a first signal by maintaining or inverting a phase of the input signal in response to a control signal;
a plurality of delay cells configured to receive the first signal and delay the first signal to generate a second signal; and
a second phase converter configured to receive the second signal and generate a third signal by maintaining or inverting a phase of the second signal in response to the control signal.

19. The delay circuit of claim 18, wherein the first phase converter includes a first inverter for inverting the phase of the input signal, second and third inverters for maintaining the phase of the input signal, and a first multiplexer for outputting an output of the first inverter or the third inverter in response to the control signal.

20. The delay circuit of claim 19, wherein the second phase converter includes a fourth and fifth inverters for maintaining the phase of the second signal, a sixth inverter for inverting the phase of the second signal and a second multiplexer for outputting an output of the fifth inverter or the sixth inverter in response to the control signal.

* * * * *